(12) United States Patent
Cheng et al.

(10) Patent No.: US 11,831,094 B2
(45) Date of Patent: Nov. 28, 2023

(54) ELECTRICAL CONNECTOR ASSEMBLY INCLUDING A BACK PLATE HAVING A CURVED INNER REGION AND A FLAT OUTER REGION

(71) Applicants: FOXCONN (KUNSHAN) COMPUTER CONNECTOR CO., LTD., Kunshan (CN); FOXCONN INTERCONNECT TECHNOLOGY LIMITED, Grand Cayman (KY)

(72) Inventors: Shan-Yong Cheng, New Taipei (TW); Chih-Kai Yang, New Taipei (TW)

(73) Assignees: FOXCONN (KUNSHAN) COMPUTER CONNECTOR CO., LTD., Kunshan (CN); FOXCONN INTERCONNECT TECHNOLOGY LIMITED, Grand Cayman (KY)

( * ) Notice: Subject to any disclaimer, the term of this patent is extended or adjusted under 35 U.S.C. 154(b) by 67 days.

(21) Appl. No.: 17/512,643

(22) Filed: Oct. 27, 2021

(65) Prior Publication Data
US 2022/0131292 A1 Apr. 28, 2022

(30) Foreign Application Priority Data

| Oct. 27, 2020 | (CN) | 202022418086.3 |
| Oct. 27, 2020 | (CN) | 202022421062.3 |
| Feb. 5, 2021 | (CN) | 202120330367.5 |

(51) Int. Cl.
*H01R 12/71* (2011.01)
*H01R 12/70* (2011.01)

(52) U.S. Cl.
CPC ....... *H01R 12/716* (2013.01); *H01R 12/7047* (2013.01)

(58) Field of Classification Search
CPC . H01R 12/716; H01R 12/7047; H05K 7/1007
See application file for complete search history.

(56) References Cited

U.S. PATENT DOCUMENTS

| 5,703,753 A * | 12/1997 | Mok | H01L 23/552 |
| | | | 174/16.3 |
| 5,945,736 A * | 8/1999 | Rife | H01L 23/4093 |
| | | | 257/726 |
| 6,014,315 A * | 1/2000 | McCullough | H01L 23/4006 |
| | | | 174/16.3 |

(Continued)

FOREIGN PATENT DOCUMENTS

| CN | 10838634 A | 2/2020 |
| CN | 110797688 A | 2/2020 |

(Continued)

*Primary Examiner* — Peter G Leigh
*Assistant Examiner* — Nelson R. Burgos-Guntin
(74) *Attorney, Agent, or Firm* — Ming Chieh Chang

(57) ABSTRACT

A connector assembly for mounting a chip module to a printed circuit board (PCB) includes: a seating mechanism including a socket connector, a metallic seat frame, and a metallic load plate; a back plate; and plural fasteners extending through the seating mechanism, the PCB, and the back plate to fasten the seating mechanism and the back plate on two opposite sides of the PCB, wherein the back plate has a curved inner region and a flat outer region and the fasteners extend through the flat outer region of the back plate.

6 Claims, 15 Drawing Sheets

(56) References Cited

U.S. PATENT DOCUMENTS

| | | | | |
|---|---|---|---|---|
| 6,021,045 A * | 2/2000 | Johnson | | H01L 23/3677 |
| | | | | 174/16.3 |
| 6,480,388 B1 * | 11/2002 | Lee | | H05K 3/301 |
| | | | | 257/E23.101 |
| 6,657,131 B2 | 12/2003 | Gonzalez et al. | | |
| 7,095,614 B2 | 8/2006 | Goldmann | | |
| 7,539,027 B2 | 5/2009 | Callahan | | |
| 7,558,066 B2 | 7/2009 | Eckberg | | |
| 7,817,429 B2 | 10/2010 | Choi | | |
| 8,619,420 B2 | 12/2013 | Degner | | |
| 10,170,391 B2 | 1/2019 | Dickover et al. | | |
| 2002/0121358 A1 * | 9/2002 | Lee | | H01L 23/4093 |
| | | | | 165/185 |
| 2002/0181206 A1 * | 12/2002 | Isenburg | | H01L 23/467 |
| | | | | 361/720 |
| 2003/0058624 A1 * | 3/2003 | Deeney | | H05K 3/325 |
| | | | | 361/736 |
| 2003/0092305 A1 * | 5/2003 | Takeuchi | | H01L 23/552 |
| | | | | 257/E23.114 |
| 2004/0017662 A1 * | 1/2004 | Liu | | H01L 23/4093 |
| | | | | 24/457 |
| 2004/0047130 A1 * | 3/2004 | Liu | | H01L 23/4006 |
| | | | | 257/E23.084 |
| 2004/0109301 A1 * | 6/2004 | Shih-Tsung | | H01L 23/4006 |
| | | | | 361/829 |
| 2004/0192074 A1 * | 9/2004 | Byquist | | H01R 12/7076 |
| | | | | 439/33 |
| 2004/0192083 A1 * | 9/2004 | Byquist | | H05K 7/1007 |
| | | | | 439/73 |
| 2005/0088821 A1 * | 4/2005 | Lee | | H01L 23/467 |
| | | | | 257/E23.099 |
| 2005/0248024 A1 * | 11/2005 | Costello | | H05K 7/1092 |
| | | | | 257/691 |
| 2006/0203452 A1 * | 9/2006 | Barina | | H01L 23/4093 |
| | | | | 257/E23.086 |
| 2007/0091576 A1 * | 4/2007 | Wung | | H01L 23/4093 |
| | | | | 257/E23.086 |
| 2007/0134948 A1 * | 6/2007 | Brodsky | | H01R 13/2407 |
| | | | | 439/66 |
| 2007/0223197 A1 * | 9/2007 | Xia | | H01L 23/4093 |
| | | | | 257/E23.086 |
| 2008/0128114 A1 * | 6/2008 | Lai | | H01L 23/473 |
| | | | | 165/80.4 |
| 2008/0144289 A1 * | 6/2008 | Desrosiers | | G01R 1/0458 |
| | | | | 257/E23.086 |
| 2008/0174952 A1 * | 7/2008 | Ye | | H01L 23/4006 |
| | | | | 361/679.48 |
| 2009/0161321 A1 * | 6/2009 | Sun | | H01L 23/4006 |
| | | | | 361/704 |
| 2009/0168349 A1 * | 7/2009 | Li | | H01L 23/467 |
| | | | | 361/697 |
| 2009/0191744 A1 * | 7/2009 | Yeh | | H01R 12/7047 |
| | | | | 439/331 |
| 2010/0330824 A1 * | 12/2010 | Ulen | | H05K 7/1053 |
| | | | | 29/527.5 |
| 2011/0277967 A1 * | 11/2011 | Fried | | F28D 15/0266 |
| | | | | 165/104.26 |
| 2012/0188711 A1 * | 7/2012 | Zeng | | G06F 1/183 |
| | | | | 361/679.58 |
| 2013/0155621 A1 * | 6/2013 | Tu | | H01L 23/4093 |
| | | | | 361/717 |
| 2014/0071647 A1 * | 3/2014 | Bridges | | H01L 23/40 |
| | | | | 361/783 |
| 2016/0205784 A1 * | 7/2016 | Kyle | | H05K 7/12 |
| | | | | 361/679.02 |
| 2017/0181284 A1 * | 6/2017 | Shah | | G01R 1/0408 |
| 2017/0371384 A1 * | 12/2017 | Ingalls | | G06F 1/20 |
| 2018/0284852 A1 * | 10/2018 | Rannow | | H01L 23/473 |
| 2018/0364279 A1 * | 12/2018 | Del Barga | | G01R 1/0466 |
| 2019/0302857 A1 * | 10/2019 | Buddrius | | G06F 1/1658 |
| 2019/0306985 A1 * | 10/2019 | Ferguson | | H01R 12/88 |
| 2020/0335432 A1 * | 10/2020 | Murtagian | | H01L 21/67144 |
| 2020/0381333 A1 * | 12/2020 | Cheng | | H01L 23/4006 |
| 2021/0126389 A1 | 4/2021 | Cheng | | |

FOREIGN PATENT DOCUMENTS

| | | |
|---|---|---|
| CN | 211980932 U | 11/2020 |
| TW | M580852 U | 7/2019 |

* cited by examiner

ELECTRICAL CONNECTOR ASSEMBLY INCLUDING A BACK PLATE HAVING A CURVED INNER REGION AND A FLAT OUTER REGION

BACKGROUND OF THE INVENTION

1. Field of the Invention

The present invention relates to a connector assembly for mounting a chip module to a printed circuit board (PCB), comprising: a seating mechanism including a socket connector, a metallic seat frame, and a metallic load plate; a back plate; and a plurality of fasteners extending through the seating mechanism, the printed circuit board, and the back plate to fasten the seating mechanism and the back plate on two opposite sides of the PCB, wherein the back plate is designed to apply a desired force distribution on the PCB.

2. Description of Related Arts

A connector assembly for mounting a chip module to a printed circuit board (PCB) is known to comprise: a seating mechanism including a socket connector, a metallic seat frame, and a metallic load plate; a back plate; and a plurality of fasteners for fastening the seating mechanism and the back plate on two opposite sides of the PCB. For example, U.S. Pat. No. 7,539,027 discloses a connector assembly wherein a backing plate has a main body and a recess portion that is sized and shaped for receiving a spring member. An another example, U.S. Pat. No. 8,619,420 discloses a connector assembly wherein a leaf spring cooperates with a backer plate to obtain a desired force distribution by basically spreading a force (eventually applied to a PCB) out over two lines of force.

SUMMARY OF THE INVENTION

A connector assembly for mounting a chip module to a printed circuit board (PCB) comprises: a seating mechanism including a socket connector, a metallic seat frame, and a metallic load plate; a back plate; and a plurality of fasteners extending through the seating mechanism, the PCB, and the back plate to fasten the seating mechanism and the back plate on two opposite sides of the PCB; wherein the back plate has a curved inner region and a flat outer region and the plurality of fasteners extend through the flat outer region of the back plate.

DETAILED DESCRIPTION OF THE PREFERRED EMBODIMENTS

Figure 1:
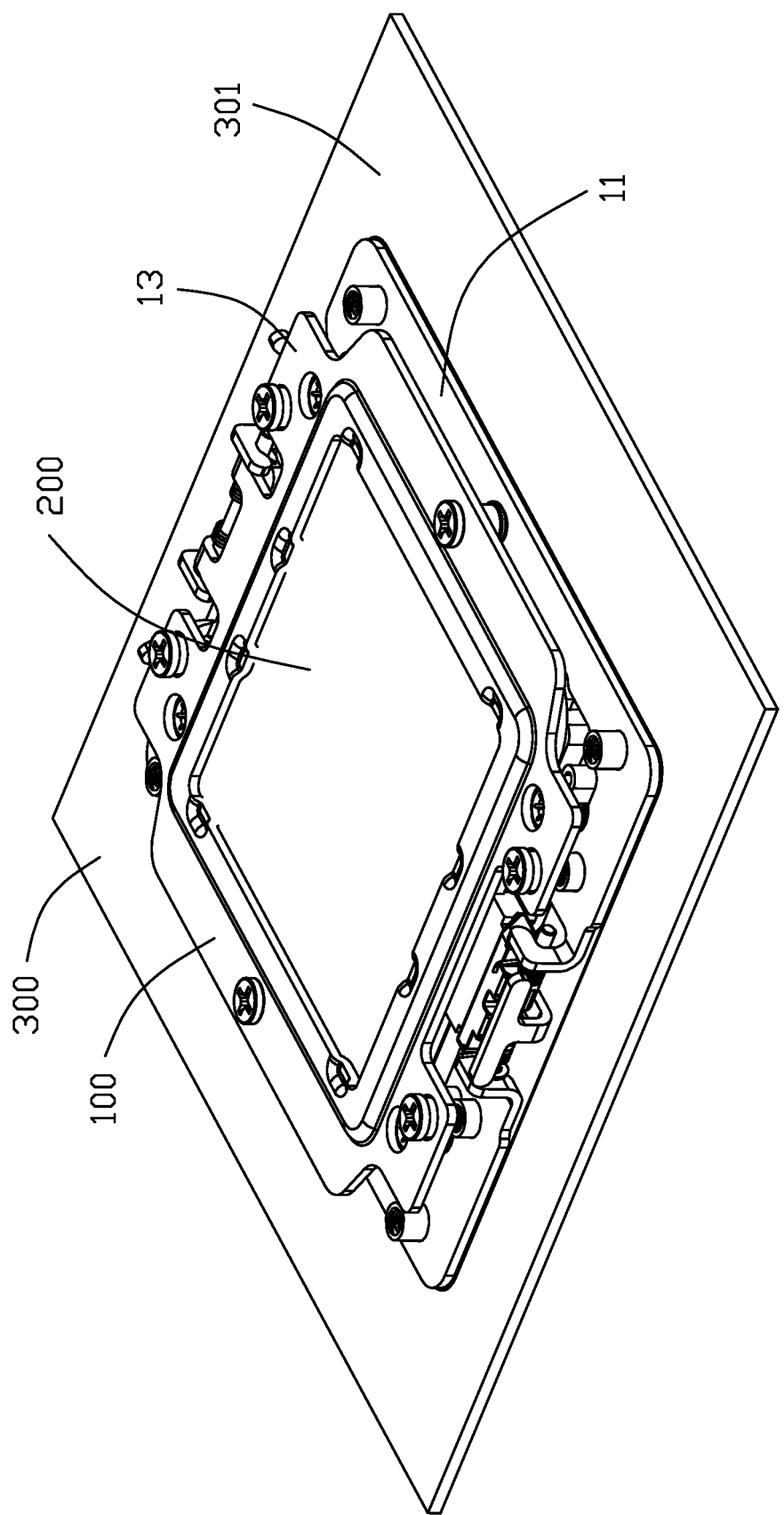
FIG. 1 is a perspective view of an electrical connector assembly for mounting a chip module to a printed circuit board in accordance with the present invention.
Figure 2:
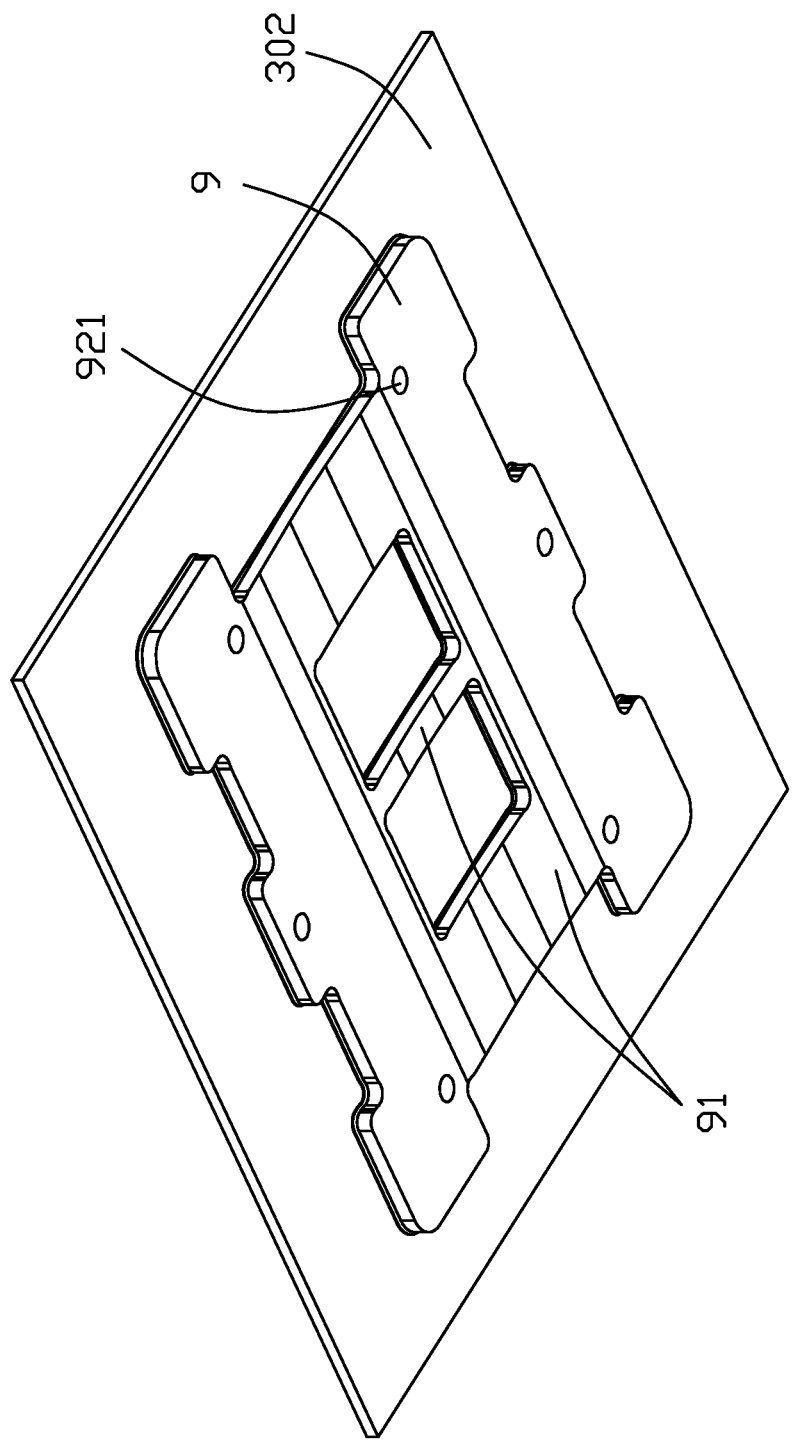
FIG. 2 is another perspective view of the electrical connector assembly.
Figure 3:
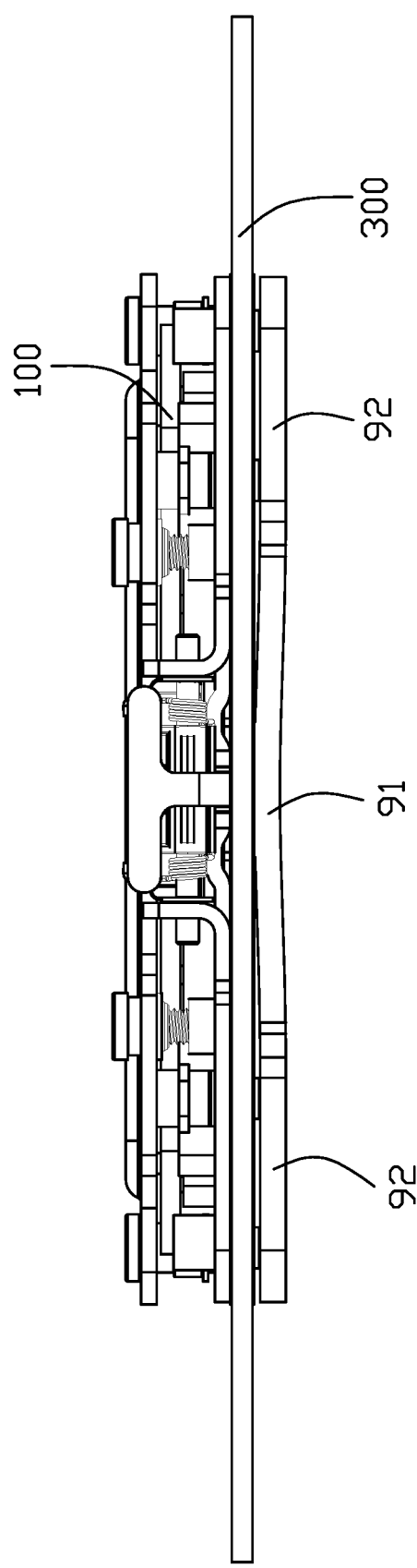
FIG. 3 is a front view of the electrical connector assembly.
Figure 4:
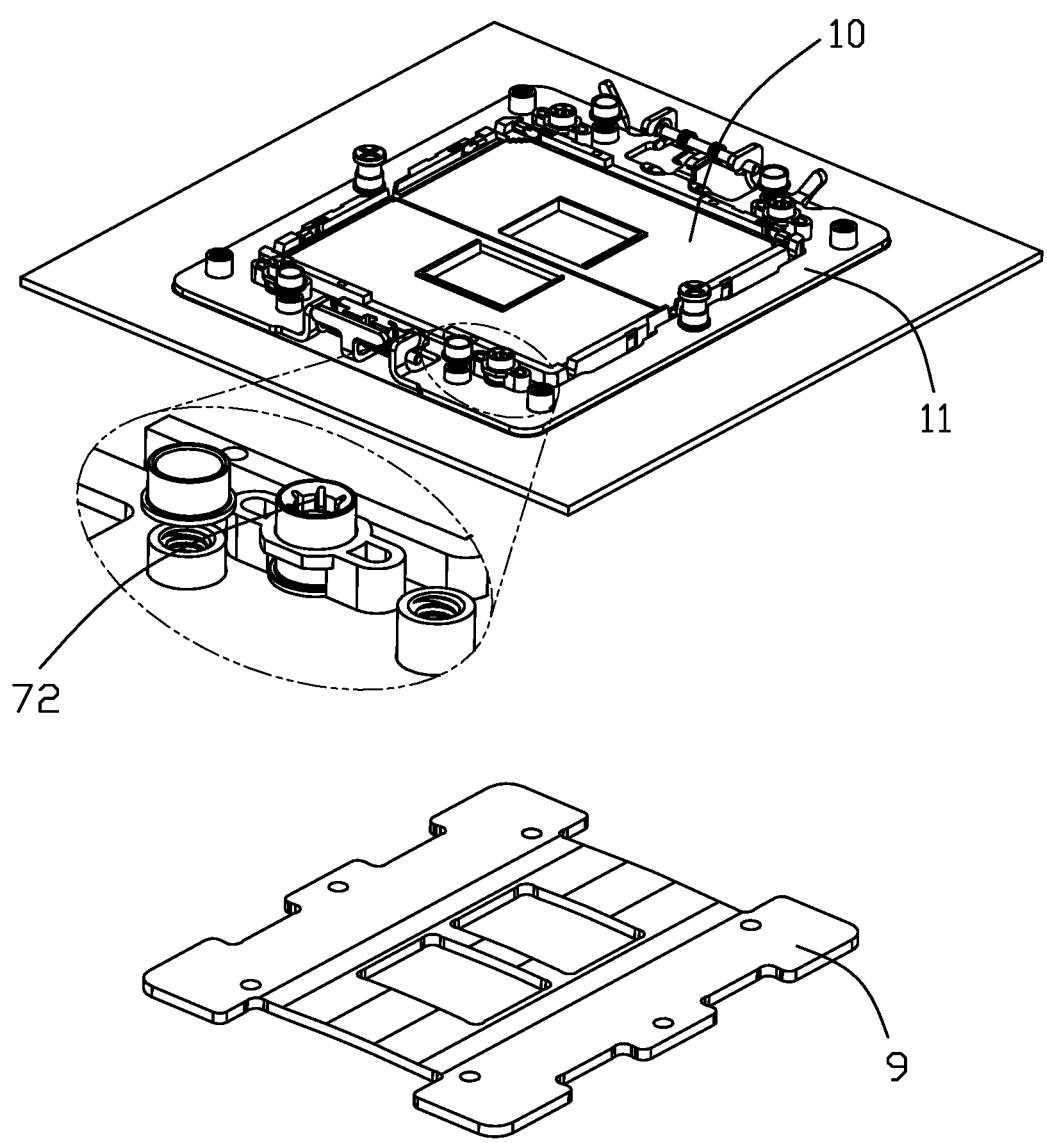
FIG. 4 is a partially exploded view of a part of the electrical connector assembly.
Figure 5:
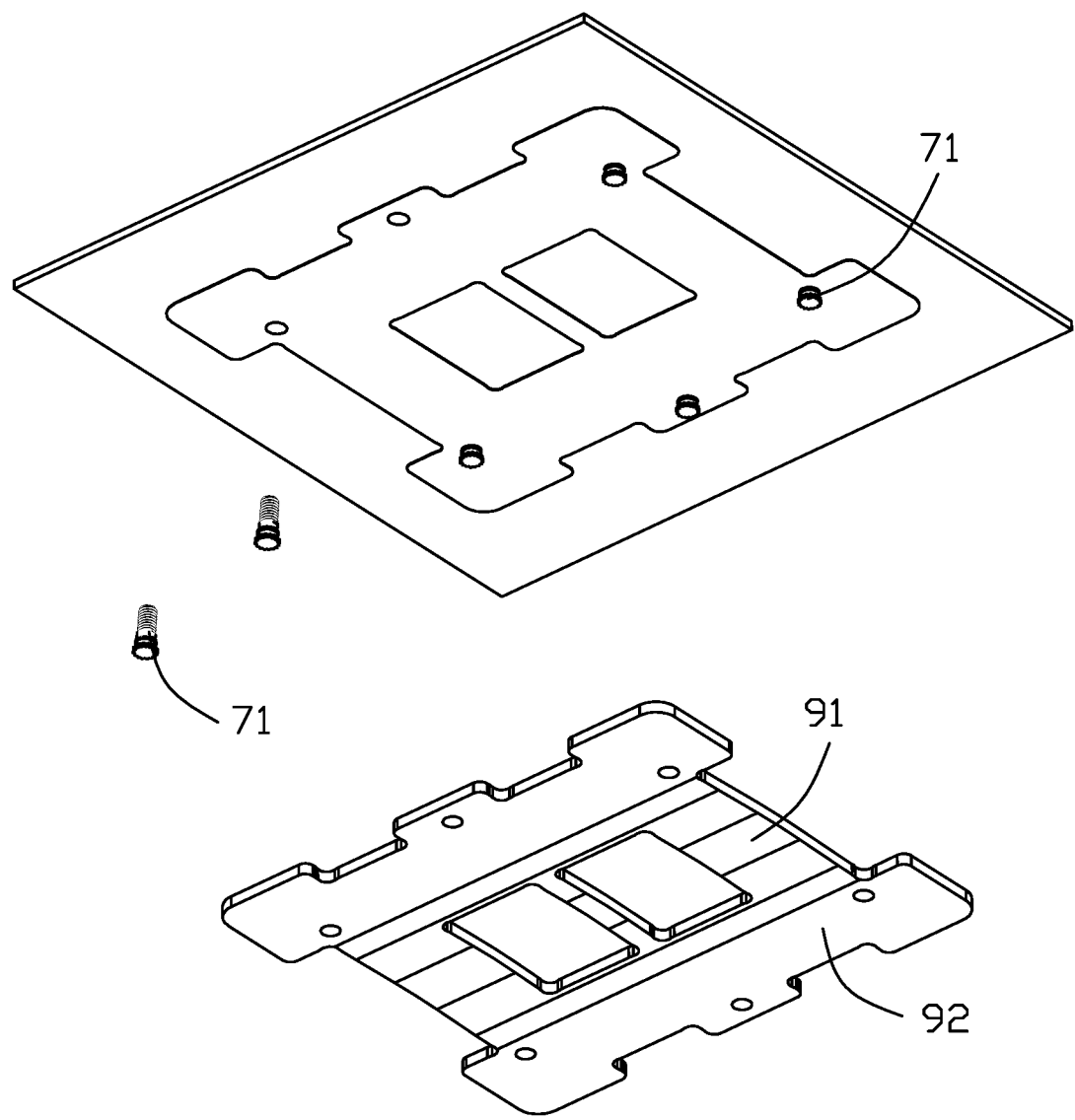
FIG. 5 is a view of FIG. 4 from another perspective.
Figure 6:
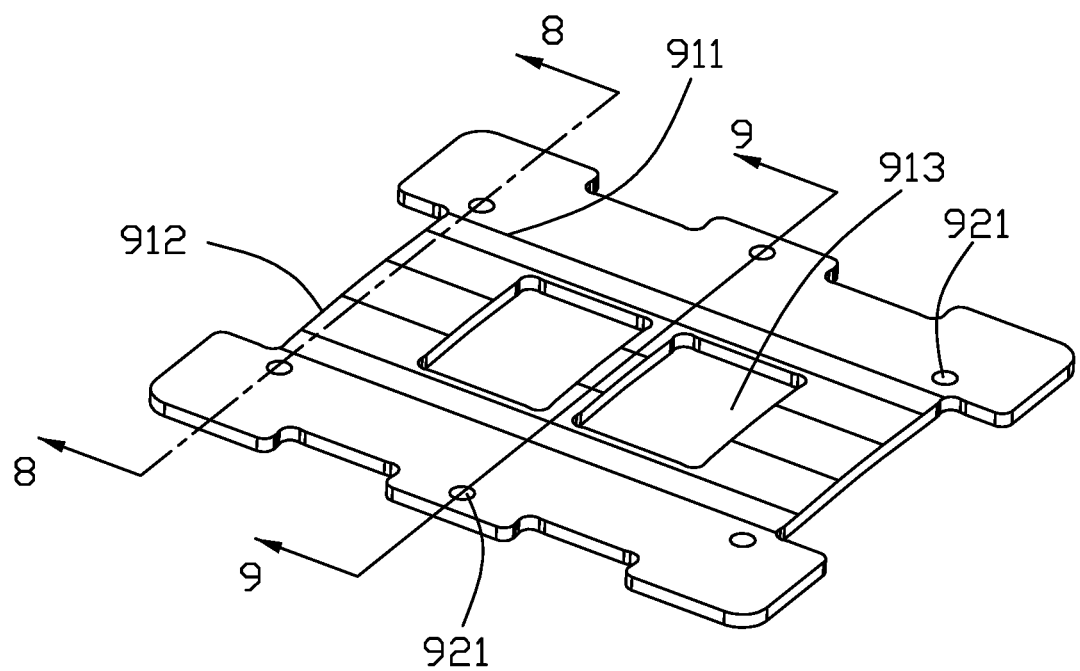
FIG. 6 is a perspective view of a back plate of the electrical connector assembly.
Figure 7:
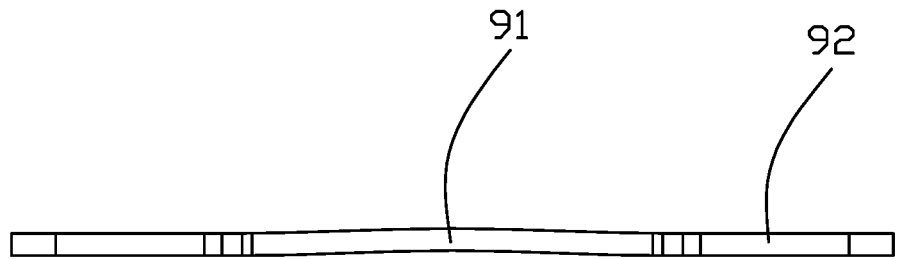
FIG. 7 is a side view of the back plate.
Figure 8:
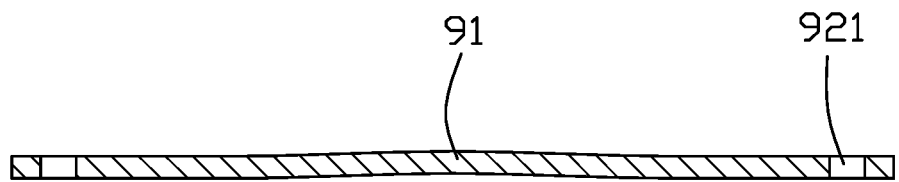
FIG. 8 is a cross-sectional view of the back plate taken along line 8-8 in FIG. 6.
Figure 9:
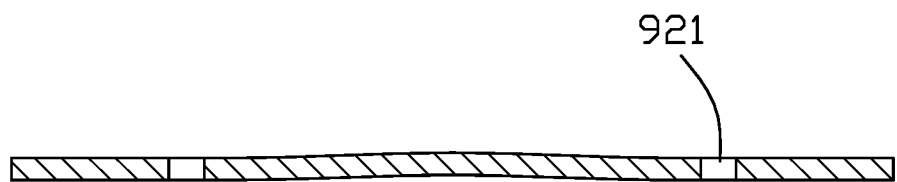
FIG. 9 is a cross-sectional view of the back plate taken along line 9-9 in FIG. 6.

Referring to FIGS. 1-5, a connector assembly 100 for mounting a chip module 200 to a printed circuit board (PCB) 300 comprises: a seating mechanism including a socket connector 10, a metallic seat frame 11, and a metallic load plate 13; a back plate 9; and a plurality of fasteners extending through the seating mechanism, the PCB 300, and the back plate 9 to fasten the seating mechanism and the back plate 9 on two opposite sides of the PCB 300. The chip module 200 may be an IC package well known in this art. The socket connector 10 may be generally of known construction including an insulative base carrying a plurality of contacts. The seating mechanism may further include a chip carrier in an independent loading mechanism (ILM) application. The seating mechanism is mounted to an upper surface 301 of the PCB 300. Each fastener may include threaded bolt 71 and nut 72 inter-engaged with each other.

Referring to FIGS. 5-9, the back plate 9 is substantially rectangular and has a curved inner region 91 and a flat outer region 92. The curved inner region 91 is bulging upward to abut against a lower surface 302 of the PCB 300. The flat outer region 92 is generally parallel to the PCB so that the bolt 71 is riveted to a planar area for ease of subsequent handling and operation.

The curved inner region 91 has a pair of long sides 911 and a pair of short sides 912 and the flat outer region 92 has a pair of portions connected with the pair of long sides 911, respectively. The curved inner region 91 has a pair of rectangular holes 913 arranged along a first direction; the curved inner region 91 is shaped like a one-dimensional bridge and curved along a second direction perpendicular to the first direction. Three holes 921 for fasteners are provided exclusively on each of the pair of portions of the flat outer region 92 in a manner generally along the first direction but slightly staggered.

Figure 10:
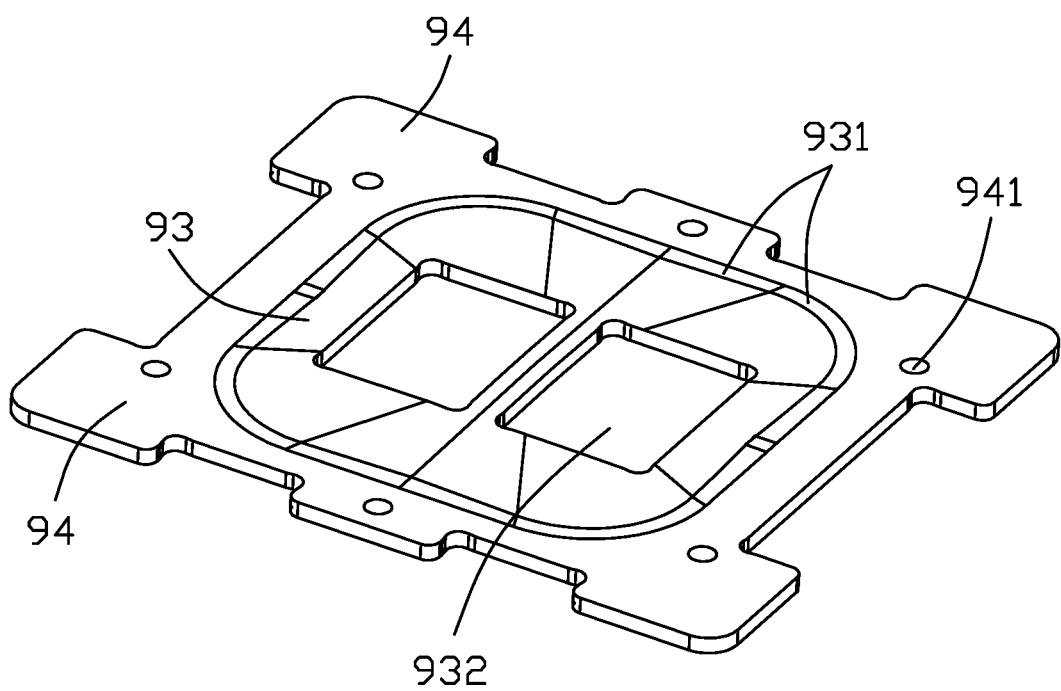
FIG. 10 is a perspective view of a varied back plate.
Figure 11:
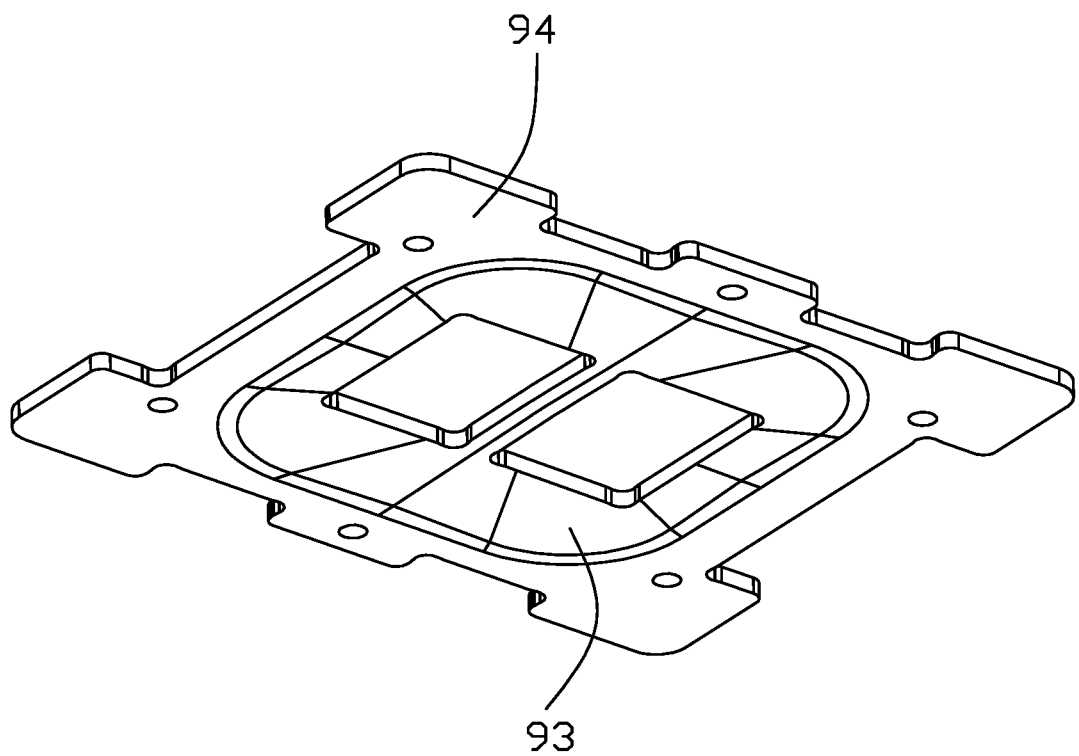
FIG. 11 is another perspective view of the varied back plate.
Figure 12:
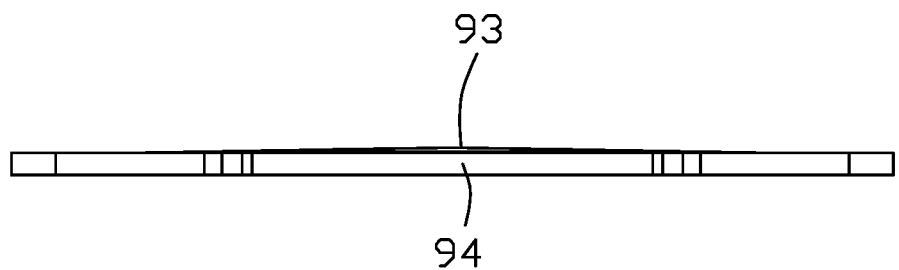
FIG. 12 is a side view of the varied back plate.

Referring to FIGS. 10-12, the back plate is varied so that a curved inner region 93 is substantially rectangular and has an edge 931 with four rounded corners while a flat outer region 94 surrounds the curved inner region 93. The curved inner region 93 is shaped like a two-dimensional mushroom top and curved along both a lengthwise and a widthwise directions. The curved inner region 93 also has two rectangular holes 932 arranged along the lengthwise direction.

In FIGS. 6-9 the curved inner region 91 is curving in one dimension; in FIGS. 10-12 the curved inner region 93 is curving in two dimensions. In either case, the curved inner region is substantially at a center of the back plate and the flat outer region is substantially at a periphery of the back plate; the threaded bolt 71 of the fastener extends through the metallic seat frame 11, the PCB 300, and the flat outer region of the back plate 9 and then the threaded nut 72 of the fastener engages the threaded bolt 71.

After the back plate 9 is fastened in place, it tends to be planar to abut against the lower surface 302 of the PCB 300. Nowadays after the chip module 200 is packaged, it may tend to have warpage, e.g., bulging upward, such that a center portion of the chip module 200 may not properly contact associated contacts of the socket connector 10. The design of the back plate 9 of the present invention will be able to alleviate such situation.

Figure 13:
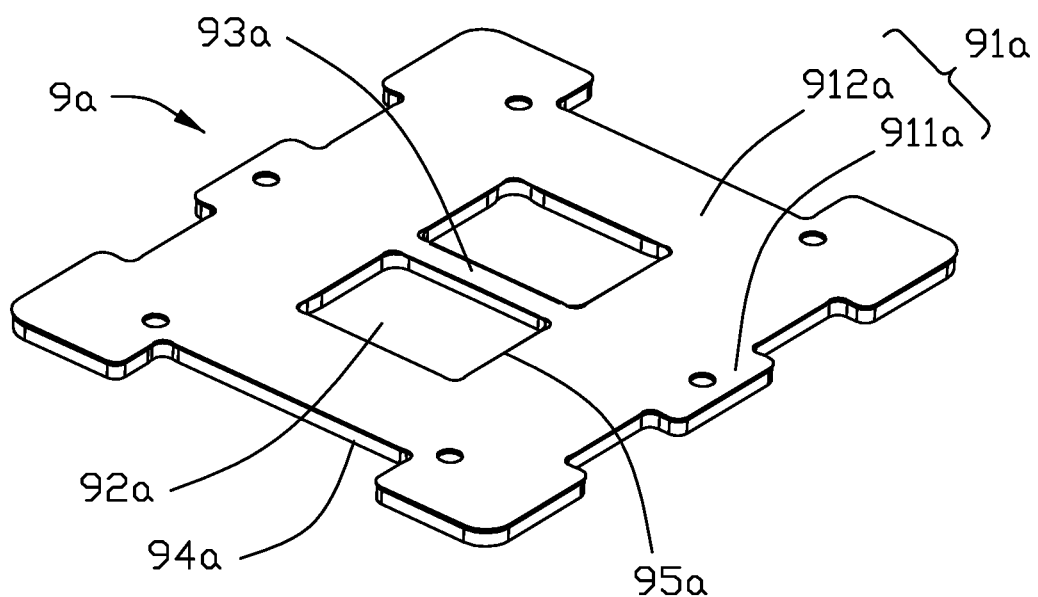
FIG. 13 is a perspective view of another varied back plate.
Figure 14:
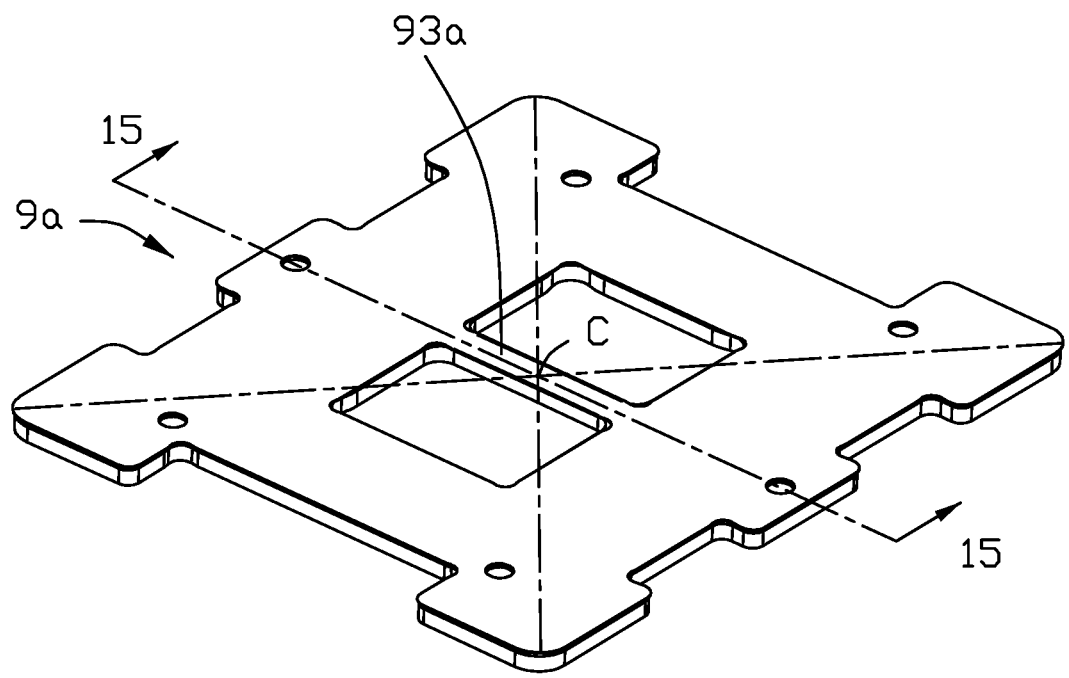
FIG. 14 is a perspective view of the back plate of FIG. 13 showing broken lines.
Figure 15:
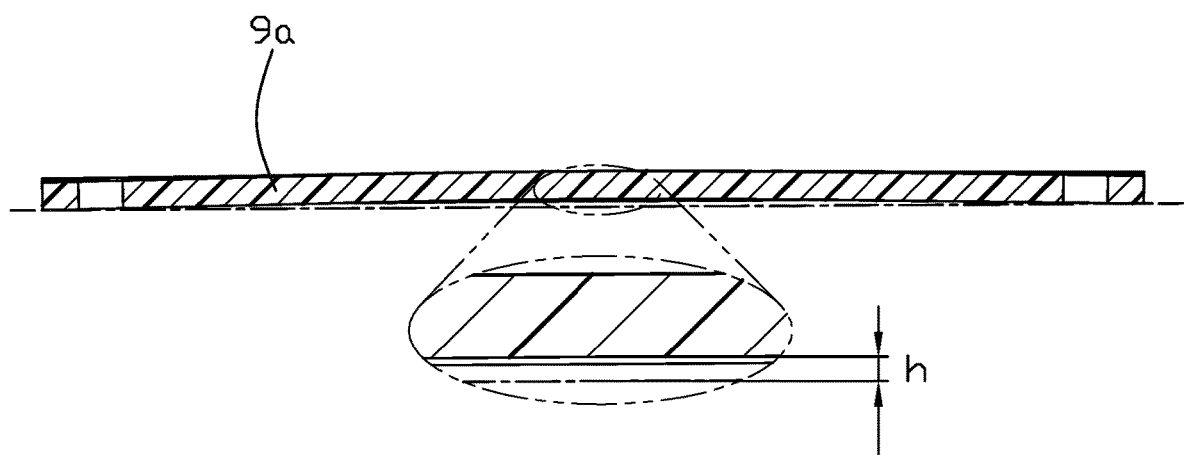
FIG. 15 is a cross-sectional view of the back plate taken along line 15-15 in FIG. 14.

Referring to FIGS. 13-15, a varied back plate 9*a* of this present invention embodiment is illustrated. The back plate 9*a* includes a frame 91*a* with a central large opening 92*a* therein and a reinforcing rib 93*a* located across the central hole and divided the central opening 92*a* into two rectangular holes. The frame 91*a* includes an outer edge 94*a* and an inner edge 95*a*. The frame 91*a* gradually bugled from the outer edge 95*a* to the inner edge 94*a* and then to the reinforcing rib 93*a*, shaped like an umbrella or mushroom. The intersection point C of the two diagonal lines of the back plate 9*a* is located at the center of the reinforcing rib 53, and the center point C of the reinforcing rib 93*a* is the highest point arching upward in the vertical direction of the back plate 9*a*. The thickness of the backplane 9*a* in the vertical direction is 2.5 mm, so that it can be easily applied to the space of a 1 U server chassis.

What is claimed is:

1. A connector assembly for mounting a chip module to a printed circuit board (PCB), comprising:
   a seating mechanism including a socket connector, a metallic seat frame, and a metallic load plate;
   a back plate; and
   a plurality of fasteners extending through the seating mechanism, the PCB, and the back plate to fasten the seating mechanism and the back plate on two opposite sides of the PCB; wherein
   the back plate has a curved inner region substantially at a center thereof for abutting against the PCB and a flat outer region; and
   the plurality of fasteners extend through the flat outer region of the back plate.

2. The connector assembly as claimed in claim 1, wherein the curved inner region is substantially rectangular and has a pair of long sides and a pair of short sides, and the flat outer region has a pair of portions connected with the pair of long sides, respectively.

3. The connector assembly as claimed in claim 2, wherein each of the pair of portions of the flat outer region of the back plate has three holes generally along a lengthwise direction of the long side but slightly staggered.

4. The connector assembly as claimed in claim 1, wherein the curved inner region is substantially rectangular, has a pair of rectangular holes arranged along a first direction, and is curved along a second direction perpendicular to the first direction.

5. The connector assembly as claimed in claim 1, wherein the curved inner region is substantially rectangular and has four rounded corners.

6. The connector assembly as claimed in claim 1, wherein each fastener includes a threaded bolt riveted to the back plate and a threaded nut for engagement to the threaded bolt.

\* \* \* \* \*